(12) United States Patent
Hametner et al.

(10) Patent No.: US 11,982,720 B2
(45) Date of Patent: May 14, 2024

(54) METHOD AND BATTERY MANAGEMENT SYSTEM FOR ASCERTAINING A STATE OF HEALTH OF A SECONDARY BATTERY

(71) Applicant: AVL LIST GMBH, Graz (AT)

(72) Inventors: Christoph Hametner, Vienna (AT); Stefan Jakubek, Vienna (AT); Markus Dohr, Graz (AT)

(73) Assignee: AVL LIST GMBH, Graz (AT)

( * ) Notice: Subject to any disclaimer, the term of this patent is extended or adjusted under 35 U.S.C. 154(b) by 553 days.

(21) Appl. No.: 17/272,239

(22) PCT Filed: Aug. 28, 2019

(86) PCT No.: PCT/AT2019/060279
§ 371 (c)(1),
(2) Date: Feb. 26, 2021

(87) PCT Pub. No.: WO2020/041814
PCT Pub. Date: May 5, 2020

(65) Prior Publication Data
US 2021/0181263 A1 Jun. 17, 2021

(30) Foreign Application Priority Data
Aug. 31, 2018 (AT) .................................. 50744/2018

(51) Int. Cl.
*G01R 31/392* (2019.01)
*G01R 31/367* (2019.01)
*G01R 31/374* (2019.01)

(52) U.S. Cl.
CPC ......... *G01R 31/392* (2019.01); *G01R 31/367* (2019.01); *G01R 31/374* (2019.01)

(58) Field of Classification Search
CPC .. G01R 31/392; G01R 31/367; G01R 31/374; G01R 31/382; G01R 31/36
(Continued)

(56) References Cited

U.S. PATENT DOCUMENTS 7,315,789 B2 * 1/2008 Plett ................... G01R 31/3842
702/65
8,041,522 B2 * 10/2011 Plett ..................... G01R 31/367
702/63
(Continued)

FOREIGN PATENT DOCUMENTS

| CN | 102253343 A | 11/2011 |
|---|---|---|
| CN | 103308864 A | 9/2013 |

(Continued)

OTHER PUBLICATIONS

Hametner C. Jakubek S.: "State of Charge estimation of Lithium Ion cells: Design of Experiments, nonlinear dentification and fuzzy observer design", Journal of Power Sources, vol. 238, 2013, pp. 413-421, XP028554478, doi:10.1016/j.jpowsour.2013.04.040.

*Primary Examiner* — M Baye Diao
(74) *Attorney, Agent, or Firm* — Dykema Gossett PLLC

(57) ABSTRACT

Various aspects of the present disclosure are directed to a method for ascertaining the state of health of a secondary battery. In one example embodiment, the method includes making a first estimation for the state of health by an observer, using an aging prediction model to ascertain a second estimation for the state of health, the aging prediction model being parameterized on the basis of the first estimation for the state of health. The first or second estimation of the state of health, or a combination of the first and second estimation of the state of health, is used as the state of health of the secondary battery.

9 Claims, 2 Drawing Sheets

(58) Field of Classification Search
USPC .......................................................... 320/127
See application file for complete search history.

(56) References Cited

U.S. PATENT DOCUMENTS

| | | | |
|---|---|---|---|
| 8,103,485 B2* | 1/2012 | Plett | H01M 10/48 |
| | | | 703/2 |
| 9,217,779 B2 | 12/2015 | Xu et al. | |
| 9,714,984 B2* | 7/2017 | Kim | G01R 31/392 |
| 9,864,016 B2 | 1/2018 | Inguva et al. | |
| 10,338,146 B2 | 7/2019 | Hametner et al. | |
| 10,663,522 B2* | 5/2020 | You | B60L 58/15 |
| 2003/0184307 A1 | 10/2003 | Kozlowski et al. | |
| 2011/0148424 A1 | 6/2011 | Chiang et al. | |
| 2011/0307202 A1 | 12/2011 | Benjamin et al. | |
| 2013/0158755 A1 | 6/2013 | Tang et al. | |
| 2013/0185007 A1* | 7/2013 | Imre | G01R 31/392 |
| | | | 702/63 |
| 2015/0120225 A1* | 4/2015 | Kim | G01R 31/392 |
| | | | 702/63 |
| 2015/0268309 A1 | 9/2015 | Kim | |
| 2015/0362559 A1 | 12/2015 | Hametner et al. | |
| 2016/0131720 A1 | 5/2016 | Baba et al. | |
| 2016/0187428 A1 | 6/2016 | Basu et al. | |
| 2016/0187432 A1 | 6/2016 | Saint-Marcoux et al. | |
| 2017/0003352 A1* | 1/2017 | Barre | G01R 31/007 |
| 2017/0288414 A1 | 10/2017 | Klein et al. | |
| 2018/0059192 A1 | 3/2018 | Seo et al. | |
| 2018/0143257 A1 | 5/2018 | Garcia et al. | |
| 2020/0412249 A1* | 12/2020 | König | H02M 3/156 |

FOREIGN PATENT DOCUMENTS

| | | | | |
|---|---|---|---|---|
| CN | 105008946 A | 10/2015 | | |
| CN | 106855610 A | 6/2017 | | |
| CN | 107238800 A | 10/2017 | | |
| CN | 108169680 A | 6/2018 | | |
| DE | 102016017528 A1 | 10/2017 | | |
| DE | 102017103617 A1 | 8/2018 | | |
| FR | 3051916 A1 | 12/2017 | | |
| JP | 2016070682 A | 5/2016 | | |
| KR | 20170085365 A | * | 7/2017 | ........... G01R 31/392 |
| TW | 201816416 A | 5/2018 | | |
| WO | 2012171730 A2 | 12/2012 | | |
| WO | 2016012196 A1 | 1/2016 | | |
| WO | 2017207891 A1 | 12/2017 | | |

* cited by examiner

METHOD AND BATTERY MANAGEMENT SYSTEM FOR ASCERTAINING A STATE OF HEALTH OF A SECONDARY BATTERY

CROSS-REFERENCE TO RELATED APPLICATIONS

This application is a national stage filing based upon International PCT Application No. PCT/AT2019/060279, filed 28 Aug. 2019, which claims the benefit of priority to Austria application No. A 50744/2018, filed 31 Aug. 2018.

BACKGROUND

The present invention relates to a method for ascertaining a state of health of a secondary battery, wherein a first estimation of the state of health is made by an observer and an aging prediction model is used to ascertain a second estimation for the state of health, wherein either the first estimation of the state of health or the second estimation of the state of health or a combination of the first and second estimation of the state of health is used as the state of health of the secondary battery. The invention relates also to a battery management system which ascertains the state of health and uses it to control the operation of the secondary battery.

When using a secondary battery (rechargeable battery), the state of charge (SoC) and the state of health (SoH) are important parameters. The state of charge indicates how far the battery is charged or discharged relative to a maximum charge. The state of health allows a statement to be made about the current state or the quality of the battery, for example based on a nominal state, and allows conclusions to be drawn about the performance or the remaining service life. However, there is no defined characteristic variable for the SoH. The internal resistance or the capacitance of the battery, or both, is usually used as the characteristic variable for the SoH, often also based on specified nominal values of the characteristic variable(s). Both variables are used in a battery management system (BMS) in order to control the operation of the battery. The state of charge can be used to decide when or how the battery should be charged, for example. A certain operating strategy can be selected using the state of health, possibly also depending on the state of charge, in order to extend the service life of the battery, but also to optimize the operation itself. A typical example is the BMS of an electric drive train of an electric vehicle or hybrid vehicle, which monitors and controls the operation of the drive battery.

The SoC and/or the SoH usually cannot be measured directly, or only with great difficulty. This applies in particular to the battery in normal use. For this reason, these variables are often estimated in the BMS from measured variables of the battery, for example by means of a control observer. Measurable variables such as the load current, the output voltage, the temperature, charging/discharging cycles, etc., are typically measured at the battery using measuring technology. An observer then ascertains a current value for the SoC and/or the SoH from said variables. Since the state of health does not change as quickly as the state of charge, the SoC may also be updated more frequently than the SoH.

WO 2014/114564 A1 describes, for example, a control observer for estimating the state of charge and the state of health of a secondary battery. Said document describes how a model structure in the form of a linear model network can be trained in order to estimate the state of charge. In this case, the current state of health can also be taken into account in the estimation of the state of charge, and the observer can be modified in order to also estimate the state of health.

In addition, it has already become known to use an aging prediction model for secondary batteries in order to estimate the remaining service life. An example of this can be found in U.S. Pat. No. 9,217,779 B2.

In principle, an aging prediction model is used to estimate the future development of the state of health of the battery as a function of a certain future load. For this purpose, there are different aging prediction models for different battery types, for example for a lithium-ion battery (Li-ion). An aging prediction model has a certain model structure and model parameters, the values of which have to be established during parameterization in order to describe the behavior of the secondary battery as accurate as possible. The parameterization of such an aging prediction model for a certain secondary battery, however, requires a high measurement effort in order to identify the dependency of the degradation (aging) of the secondary battery on various influencing variables, such as the number of charging/discharging cycles, the period of operation, the temperature, the capacitance rate (a measure for the speed of discharge), the state of charge (or the reciprocal value, what is referred to as the degree of discharge), etc., and to be able to represent said dependency using the model. For the parameterization of the aging prediction model, a large number of measurement data would be required in order to be able to estimate or establish the parameters of the model. In addition, there may be additional effects which make the parameterization more difficult, such as a faster degradation toward the end of the service life of the secondary battery or the distinction between degradation due to cyclical loading and calendar aging (due to the period of operation). It would be an immense effort to ascertain the aging prediction models for all of the different secondary batteries or cells of secondary batteries purely by means of measurements and analysis of the measurement data. What are referred to as accelerated aging tests are therefore often also used. However, the results of such an accelerated aging test sometimes cannot or cannot directly be applied to the significantly slower aging in real operation of the secondary battery and are therefore only of limited use.

A problem of the present invention is therefore that of providing a method by means of which a state of health of a secondary battery can be ascertained more easily.

SUMMARY OF THE INVENTION

This problem is solved according to the invention in that the aging prediction model being parameterized using the first estimation for the state of health. In this way, on the one hand, while the battery is in operation, an aging prediction model for the secondary battery can be parameterized from the state of health estimated by an observer. It is therefore no longer necessary to parameterize the aging prediction model using measurement data in advance in a complex manner. The aging prediction model is instead adapted during operation. On the other hand, the two present first and second estimations for the state of health can also be combined in order to obtain a higher quality estimation of the state of health. In this case, the combination can be determined or predefined in advance and/or can be adapted to the relevant application in order to use an ideal combination.

For the parameterization, aging factors are preferably determined for a certain period of operation of the secondary battery from detected variables of the secondary battery, and parameters of the aging prediction model are ascertained from the determined aging factors and the first estimations for the state of health in this period, by means of which parameters the aging prediction model is parameterized. For this purpose, the aging factors are advantageously ascertained from existing measured variables of the secondary battery and/or variables derived therefrom.

It is very particularly advantageous to use the first estimations for the state of health, and, optionally, aging factors, of a plurality of secondary batteries in order to parameterize the aging prediction model. In this way, the parameterization can be based on more data, which improves the quality of the parameterization. Likewise, the different operating states of the various secondary batteries can also improve the quality of the parameterization.

The state of health of the secondary battery can be ascertained simply as a weighted sum of the first estimation of the state of health and the second estimation of the state of health, it being possible for the weighting to be predefined or adapted. Since uncertainties or confidence intervals are also usually ascertained during the parameterization, the weighting can advantageously also take place on the basis of the uncertainties or confidence intervals of the first and second estimations. An operating characteristic of the secondary battery can also be taken into account in the combination. This gives various options for combining the two existing estimations of the state of health. The ascertainment of the state of health therefore can easily be optimally adapted to the relevant use.

BRIEF DESCRIPTION OF THE DRAWINGS

The present invention is described in greater detail below with reference to FIGS. 1 to 4, which show exemplary, schematic and non-limiting advantageous embodiments of the invention. In the drawings

DETAILED DESCRIPTION

Figure 1:
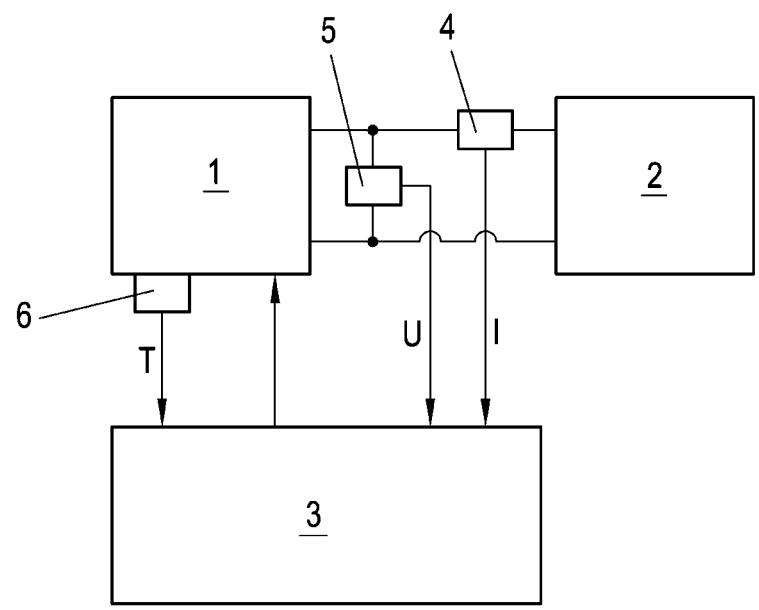
FIG. 1 shows a secondary battery for supplying an electrical load, which is controlled by a battery management system.

FIG. 1 shows a secondary battery 1 which is connected to an electrical load 2. The electrical load 2 is, for example, an electrical drive of an electric vehicle or a hybrid vehicle. The secondary battery 1 is controlled and monitored by a battery control unit, usually referred to as battery management system 3. The battery management system 3 controls measures, in order to optimize the performance and service life of the secondary battery 1. Typical functions of the battery management system 3 are protecting the individual cells of the secondary battery 1, balancing the battery cells, controlling charging, determining the state of charge SoC, determining the state of health SoH, but also storing operating data also in the form of temporal profiles. In addition, the battery management system 3 can also be provided with a data communication interface in order to be able to exchange data and information with other control units, for example a hybrid drive train control unit or a vehicle control unit, but also to be able to read out or transmit data regarding the secondary battery 1 as required (for example for maintenance purposes).

For this purpose, the battery management system 3 receives measured variables of the secondary battery 1 which characterize the operation of the secondary battery 1, typically the load current I and the output voltage U, but also the temperature T. For this purpose, current sensors 4, voltage sensors 5 or temperature sensors 6 can also be provided. Of course, other and/or further measurable variables of the secondary battery 1 can also be measured and processed in the battery management system 3.

Figure 2:
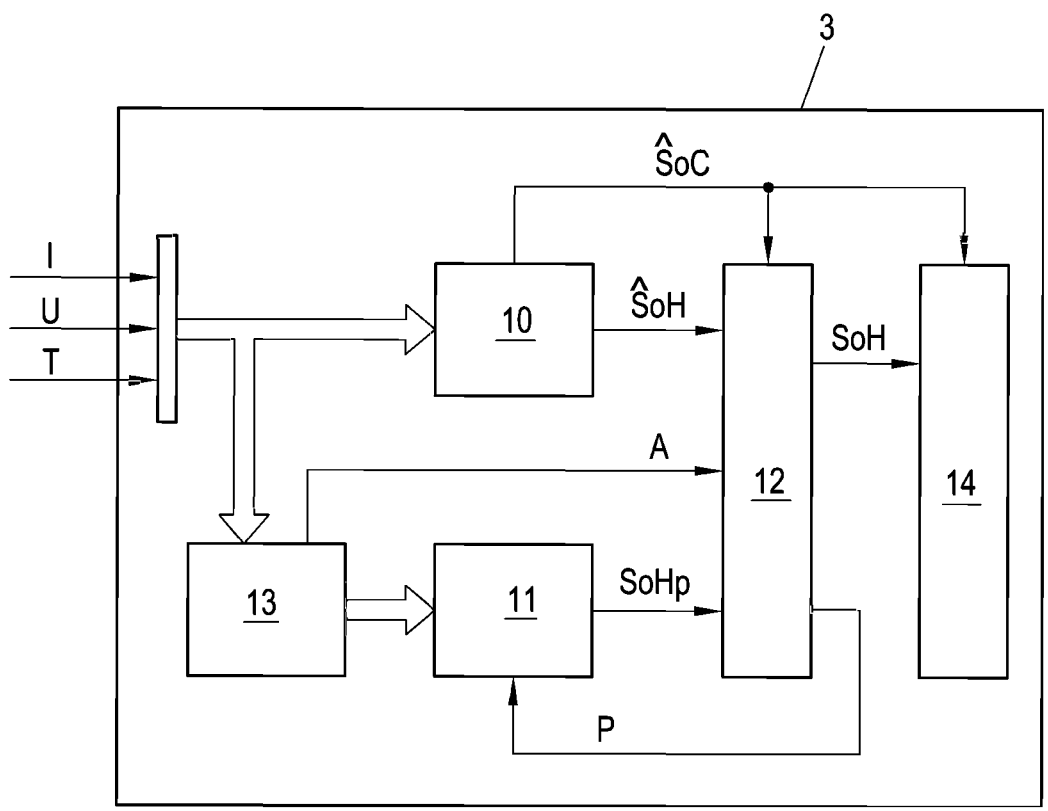
FIG. 2 shows a battery management system according to the invention.

In order to be able to ascertain the state of health SoH of the secondary battery 1 in a simple manner, the embodiment of the battery management system 3 (hardware and/or software) according to the invention is described in more detail in FIG. 2. In order to be able to carry out the intended tasks, the state of charge SoC and the state of health SoH are particularly important for the battery management system 3. An observer 10 is therefore implemented in the battery management system 3, for example, in order to estimate the state of charge $\hat{SoC}$ and the state of health $\hat{SoH}$, estimated values of the observer 10 being denoted by "^." The observer 10 is designed, for example, as described in WO 2014/114564 A1. The observer 10 is usually based on a model of the secondary battery 1, which describes the behavior of the secondary battery 1.

In addition, an aging prediction model 11 is implemented in the battery management system 3. By means of an aging prediction model 11, the future development of the state of health $SoH_p$ of the secondary battery 1 can be ascertained as a function of a certain future load on the secondary battery 1. For this purpose, however, the aging prediction model 11 has to be parameterized, i.e., the parameters of the aging prediction model 11 have to be determined such that the behavior of the secondary battery 1 with regard to the development of the state of health $SoH_p$ is described as accurate as possible. However, this parameterization is usually very complex. In order to overcome this problem, according to the invention the values for the state of health $\hat{SoH}$ determined by the observer 10 in the battery management system 3 are used to parameterize the aging prediction model 11, as explained in more detail below.

The aging prediction model 11 can generally be written in the form $\Delta SoH_i = f(A_i, P)$. In said form, $\Delta SoH_i$ describes the change in the state of health SoH in a certain period which is expressed by the index i. f describes the, usually nonlinear, model structure, for example a local model network, a polynomial model, a Gauss process model, etc., having the parameters P. $A_i$ includes all of the aging factors which are taken into account in the model. Possible or frequently used aging factors A are the number of charging/discharging cycles, the period of operation, the temperature, the capacitance rate (a measure of the speed of discharge), the state of charge, the degree of discharge, the state of health and/or a heating coefficient, it also, of course, being possible to use further or different aging factors. The aging factors are particularly dependent on the load of the secondary battery 1. The state of health SoH is then obtained by adding up the individual changes $\Delta SoH_i$ of the individual periods of time, i.e., $$SoH = \sum_{i=1}^{n} \Delta SoH_i.$$

It is obvious that both a current state of health SoH (up to the current period), but also a future development of the state of health SoH, if certain loads are assumed for future periods, can be calculated thereby.

The aging prediction model 11 can be implemented as a polynomial model, for example, wherein a charge quantity Q, as a measure of the capacitance of the secondary battery 1, is used as the state of health SoH, for example. In said model as aging factors A, the factors $t_i$ as the current time step in a time unit, $Ah_i$ as ampere-hour throughput in time step $t_i$, $T_i$ as the temperature in time step $t_i$ (e.g., the average or maximum temperature) and $T_0$ as the temperature at which the aging reaches a minimum (e.g., 25° C.) are used and the parameters $P=[p_1, p_2, p_3, p_4, p_5, p_6]$ are used to describe the behavior of the aging of the secondary battery 1. A capacitance loss $\Delta Q_i$ in time step $t_i$ is calculated therewith according to formula $\Delta Q_i = p_1\sqrt{t_i} + p_2 t_i + p_3\sqrt{Ah_i} + p_4 Ah_i + p_5 t_i Ah_i + p_6(T_i - T_0)^2 \, Ah_i$. The state of health SoH is then obtained as a loss of capacitance Q by adding up the individual time steps $t_i$, i.e., in the form $$SoH = \sum_{i=1}^{n} \Delta Q_i.$$

Of course, a total charge loss Q could also be ascertained and this could be converted to another parameter for the state of health SoH.

The state of health $SoH_p$ ascertained in this way using the aging prediction model 11 can be a capacitance (also as the charge quantity Q) of the secondary battery 1 or an internal resistance of the secondary battery 1, or both, or another characteristic value.

It should be noted, however, that other model structures than those mentioned can of course also be used for the aging prediction model 11. It is also possible that no changes $\Delta SoH_i$ are calculated using the model, which changes are then added up, but that the state of health $SoH_p$ is calculated directly. For the invention, the specific choice of the model structure, the aging factors and the implementation of the model is ultimately irrelevant and can also be dependent on the type of secondary battery 1.

It is also well known how a model having a certain model structure and having parameters P can be trained for parameterization, which is why it is only briefly discussed. Known measurement data of the secondary battery 1 are substantially required for this purpose, i.e., measurement data for the state of health SoH and for the aging factors A. Some of the known measurement data can be used for parameterization, different parameterization methods being possible for different model structures. The remaining part of the measurement data can be used to validate the parameterized model, i.e., to check how precisely the parameterized model approximates the behavior of the battery. In Hametner C., Jakubek S., "State of Charge estimation of Lithium Ion cells: Design of Experiments, nonlinear identification and fuzzy observer design," Journal of Power Sources 238 (2013) 413-421 this is described, for example, for a local model network for estimating the state of charge SoC of a secondary battery 1. WO 2014/114564 A1 also describes this with the additional estimation of the state of health SoH. In addition, well-known parameter estimation methods can be used which minimize a certain defined error (e.g., a mean squared error) by varying the parameters. Such methods are usually iterative methods, the iterations being carried out until a certain termination criterion is met, for example a certain number of iterations or the reaching of a certain error limit. In the parameterization, the parameters P are generally selected such that the known measurement data are approximated as closely as possible by the model. The remainder of the known measurement data can then be used to validate the specific model, from which confidence intervals can also be determined, which allow a statement to be made about the uncertainty of the estimation.

In the simplest case, the parameterization, i.e., the determination of the parameters P, can take place directly by means of a conventional least squares estimation. The parameters P of the model can, however, themselves depend on the aging factors $A_i$. In this case, known non-linear methods, for example gradient-based methods, can be used to estimate the parameters. In addition, trial functions, such as what is referred to as a hazard function for describing the failure/damage rate, can also be used in order to be able to represent non-linear aging processes, such as accelerated aging at the beginning and end of the service life. Such methods for parameterization are sufficiently known to a person skilled in the art, which is why they do not have to be discussed in more detail here.

As part of the parameterization, the parameterization method often also ascertains confidence intervals or uncertainties of the respective estimations, for example from the validation of the parameterized model. The more precise the estimation, the smaller the uncertainty or the larger the confidence interval.

According to the method according to the invention, however, there are no such measurement data for parameterization, but the values for the state of health SoH estimated by the observer 10, and optionally also other values estimated by the observer 10, in particular for the state of charge $\hat{SoC}$, are used. The observer 10 estimates values for the state of charge $\hat{SoC}$ in predefined time steps, for example in the second or minute range. Since the state of health SoH only changes slowly, it can be calculated in the observer 10 in significantly larger time steps, for example in the hour range. The estimations of the observer 10 for the state of health $\hat{SoH}$ are collected in a computing unit 12 (hardware and/or software). In parallel therewith, aging factors A are ascertained in a data collection unit 13 (hardware and/or software) from the operation of the secondary battery 1. The data collection unit 13 can, however, also be part of the computing unit 12 or also of the aging prediction model 11. For example, the number of charging and discharging cycles in a certain period i can be ascertained from the curve of the current I and/or voltage U. A heating coefficient can be ascertained proportionally to the squared current I, for example. The temperature, also as a time curve, can be obtained directly as a measured value, for example from a temperature sensor 6. Other aging factors A can also be ascertained in the computing unit 12 (or also in the data collection unit 13), for example a degree of discharge or a capacitance rate from the states of charge $\hat{SoC}$ estimated by the observer 10. The aging factors A can be ascertained for a certain period (index i) or for the entire period of operation of the secondary battery 1. Aging factors A are typically cumulative, weighted or averaged quantities of certain measured variables.

However, "measurement data", which can be used for the parameterization of the aging prediction model 11, are in turn present in the computing unit 12 with the values for the state of health $\hat{SoH}$ estimated by the observer 10 and the aging factors A ascertained in parallel therewith. The parameters P of the aging prediction model 11 are updated at certain points in time on the basis of the newly added, and possibly already known, "measurement data". This means that the parameterization by means of the provided parameterization method is repeated using the supplemented measurement data. At the beginning, the aging prediction model 11 can be parameterized on the basis of empirical values or using known data from similar batteries. During the operation of the secondary battery 1, the aging prediction model 11 is continuously updated on the basis of actual data from the secondary battery 1, such that the aging prediction model 11 is practically trained during the operation of the secondary battery 1.

Figure 3:
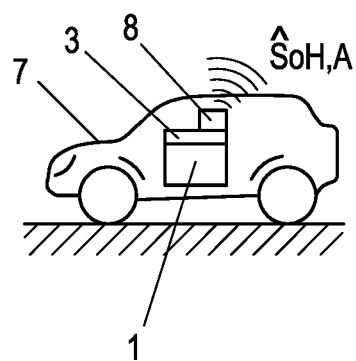
FIG. 3 shows an embodiment comprising external parameterization of the aging prediction model and FIG. 4 shows an embodiment comprising external parameterization of the aging prediction model on the basis of data from various secondary batteries.
Figure 3:
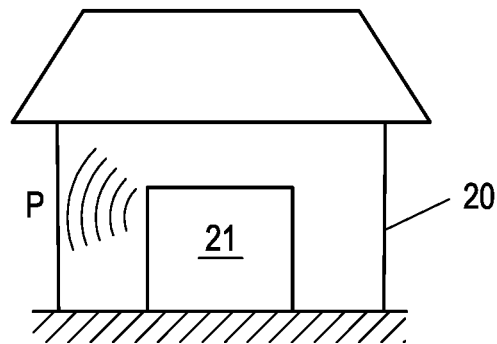

However, the aging prediction model 11 does not necessarily have to be parametrized online, or in the battery management system 3, as is explained with reference to FIG. 3. The values for the state of health $\hat{S}oH$ estimated by the observer 10 and the ascertained aging factors A can also be transmitted to a center 20 in which a computing unit 21 is provided in which the parameters P are ascertained as described. The parameters P are then transmitted back to the battery management system 3 at certain time intervals, and the aging prediction model 11 in the battery management system 3 is updated using said parameters. For this purpose, a data communication unit 8 can also be provided on the battery management system 3 in order to transmit and receive the required data. For this purpose, however, a data communication unit 8 of the device in which the secondary battery 1 and the battery management system 3 are used, for example a vehicle 7 as in FIG. 3, can also be used.

Figure 4:
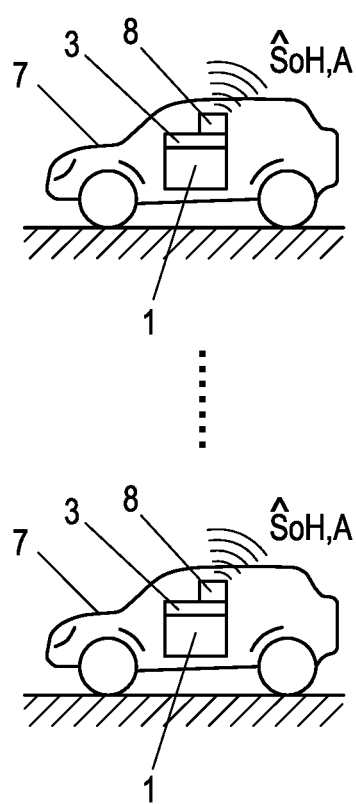
Figure 4:
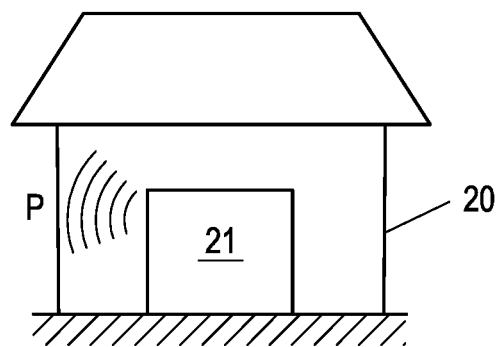

In this way, the data from a plurality of secondary batteries 1 of the same type can be transmitted to the center 20 and the computing unit 21 and used to parameterize the aging prediction model 11, as shown in FIG. 4. The parameterization of the aging prediction model 11 can be improved if more data are available about the secondary battery 1, which can be achieved in this way. This is of interest, for example, in the case of hybrid vehicles or electric vehicles which are equipped with the same secondary batteries 1.

Various battery management systems 3 of secondary batteries 1 of the same type can, however, also exchange data with one another in an analogous manner in order to obtain more data for the parameterization of the aging prediction model 11.

The aging prediction model 11 can, however, also be used to obtain an estimation for the state of health $SoH_p$ of the secondary battery 1 at certain points in time. For example, aging factors $A_i$ are collected following the most recent update of the aging prediction model 11, and a change $\Delta SoH_i$ in the state of health SoH in this period since the most recent update is calculated therefrom. By adding up as described above, a model prediction for the current state of health $SoH_p$ is then obtained based on the last point in time considered (index i−1). Two estimations for the state of health SoH are thus obtained for the current point in time, one state of health $\hat{S}oH$ from the observer 10 and one state of health $SoH_p$ from the aging prediction model 11. These two estimations can now also be combined, for example in the computing unit 12 as in FIG. 2, in order to obtain a state of health SoH with a high-quality estimation, i.e., SoH=f($\hat{S}oH$, $SoH_p$), where f describes the combination. This state of health SoH can then be used in the battery management system 3, for example in a control unit 14 (hardware and/or software) for monitoring and controlling the function of the secondary battery 1.

The combination f of the two estimations for the state of health $\hat{S}oH$, $SoH_p$ can take place in various ways. For example, an average of the two estimations could simply be formed. It would also be conceivable to form a weighted sum from the two estimations, it being possible for the weighting factors to be based on the confidence intervals or uncertainties of the respective estimations, for example. An estimation having a small uncertainty could thus be weighted higher than an estimation having a higher uncertainty. However, information from the operation of the secondary battery 1 could also be used in order to make decisions as to which of the estimations is used or how they are combined. For example, in the case of an operating characteristic having low excitation of the secondary battery 1, for example in the case of primarily calendar aging, the estimation of the state of health $SoH_p$ using the aging prediction model 11 can be trusted more than the estimation of the state of health SoH by the observer 10. The estimation using the aging prediction model 11 can thus be weighted higher or only the estimation of the aging prediction model 11 can be used. Conversely, in the case of operating characteristics having sufficient excitation of the secondary battery 1, for example in the case of a sufficient driving operation of a hybrid or electric vehicle, the estimation by the observer 10 can be trusted more. The estimation by the observer 10 can thus be weighted higher or only the estimation of the observer 10 can be used. It is obvious that there may be many other possibilities for combining the two estimations of the state of health $SoH_p$, $\hat{S}oH$, in order to obtain a higher-quality estimation of the state of health SoH.

The aging prediction model 11 may also only be updated if the estimations by the observer 10 can be sufficiently trusted. In the case of low excitation of the secondary battery 1 (e.g., mainly calendar aging), an update can be omitted, for example, while in the case of sufficient excitation, the update can take place at fixed points in time.

The invention claimed is:

1. Method for ascertaining a state of health of a secondary battery, including the following steps:
   a first estimation for the state of health is made by an observer,
   using an aging prediction model with parameters to ascertain a second estimation for the state of health, the aging prediction model is parameterized on the basis of the first estimation for the state of health, wherein the parameters of the aging prediction model are updated based on the first estimation for the state of health,
   wherein either the first estimation of the state of health or the second estimation of the state of health or a combination of the first and second estimation of the state of health is used as the state of health of the secondary battery.

2. The method according to claim 1, further including the steps of:
   determining aging factors for a certain period of operation of the secondary battery from detected variables of the secondary battery, and
   ascertaining the parameters of the aging prediction model from the determined aging factors and the first estimations for the state of health in this period, by means of which parameters the aging prediction model is parameterized.

3. The method according to claim 1, characterized in that first estimations for the state of health of a plurality of secondary batteries are used to parameterize the aging prediction model.

4. The method according to claim 1, characterized in that the state of health is ascertained as a weighted sum of the first estimation for the state of health and the second estimation for the state of health.

5. The method according to claim 4, characterized in that the weighting takes place on the basis of uncertainties or confidence intervals of the first and second estimation and/or on the basis of an operating characteristic of the secondary battery.

6. Use of the state of health ascertained in accordance with the method according to claim 1 for a secondary battery in a battery management system for controlling the operation of the secondary battery.

7. Battery management system for controlling the operation of a secondary battery, the battery management system comprising:
an observer configured and arranged to ascertain a first estimation of a state of health of the secondary battery,
an aging prediction model with parameters configured and arranged to ascertain a second estimation for the state of health and
wherein in the battery management system, the operation of the secondary battery is controlled using either the first estimation of the state of health or the second estimation of the state of health or using a combination of the first and second estimation of the state of health ascertained with a computing unit in the battery management system as the state of health of the secondary battery characterized in that the computing unit parameterizes the aging prediction model on the basis of the first estimation of the state of health, wherein the parameters of the aging prediction model are updated based on the first estimation for the state of health.

8. The battery management system according to claim 7, further including a data collection unit configured and arranged to ascertain aging factors from measured variables of the operation of the secondary battery, and
wherein the computing unit is further configured and arranged to parameterize the aging prediction model on the basis of the first estimation for the state of health and the ascertained aging factors.

9. The method according to claim 1, characterized in that first estimations for the state of health and aging factors of a plurality of secondary batteries are used to parameterize the aging prediction model.

* * * * *